US008837101B2

(12) United States Patent  
Rouaud

(10) Patent No.: US 8,837,101 B2  
(45) Date of Patent: Sep. 16, 2014

(54) VOLTAGE-MODIFYING DEVICE FOR ELECTRIC METER

(75) Inventor: Didier Gilbert Rouaud, Kennesaw, GA (US)

(73) Assignee: General Electric Company, Schenectady, NY (US)

( * ) Notice: Subject to any disclaimer, the term of this patent is extended or adjusted under 35 U.S.C. 154(b) by 389 days.

(21) Appl. No.: 13/210,499

(22) Filed: Aug. 16, 2011

(65) Prior Publication Data

US 2013/0044400 A1 Feb. 21, 2013

(51) Int. Cl.
*H02H 3/20* (2006.01)
*G01R 21/133* (2006.01)
*G01R 15/08* (2006.01)
*G01R 22/06* (2006.01)

(52) U.S. Cl.
CPC .............. *G01R 21/133* (2013.01); *G01R 22/06* (2013.01); *G01R 15/08* (2013.01)
USPC ............... 361/91.1; 361/56; 361/90; 361/111

(58) Field of Classification Search
CPC ........... H02H 3/00; H02H 3/20; H02H 3/207; H02H 3/24; H02H 3/202; G01R 15/08; H05K 7/00; H03K 17/0822; H03K 19/00315; H02J 7/0031; G06F 1/28; H01L 27/0251
See application file for complete search history.

(56) References Cited

U.S. PATENT DOCUMENTS

| | | | |
|---|---|---|---|
| 4,433,287 A | 2/1984 | Morita et al. | |
| 5,392,188 A | 2/1995 | Epstein | |
| 5,544,089 A | 8/1996 | Hemminger | |
| 5,572,396 A * | 11/1996 | Robinson | 361/117 |
| 5,574,362 A | 11/1996 | Fiorina | |
| 6,046,582 A | 4/2000 | Sanelli et al. | |
| 7,432,720 B1 | 10/2008 | Quaife | |
| 2004/0027101 A1* | 2/2004 | Vinciarelli | 323/259 |
| 2004/0032267 A1* | 2/2004 | Hargrove | 324/543 |
| 2004/0105206 A1* | 6/2004 | Schleifer | 361/111 |
| 2008/0234957 A1 | 9/2008 | Banhegyesi | |
| 2011/0309811 A1* | 12/2011 | Kondo et al. | 323/282 |
| 2012/0026007 A1* | 2/2012 | Beattie | 340/870.02 |

FOREIGN PATENT DOCUMENTS

| | | |
|---|---|---|
| CN | 201751848 U | 2/2011 |
| CN | 102116794 A | 7/2011 |
| FR | 2438846 A1 | 5/1980 |
| WO | 2010100392 A1 | 9/2010 |

OTHER PUBLICATIONS

Unofficial English translation of Office Action from NZ dated Aug. 14, 2013.
Search Report and Written Opinion for corresponding EP Application No. 12180017.1-1524, dated Jan. 22. 2013.

* cited by examiner

*Primary Examiner* — Jared Fureman
*Assistant Examiner* — Terrance Willoughby
(74) *Attorney, Agent, or Firm* — Hoffman Warnick LLC; William Heinze

(57) ABSTRACT

Aspects of the invention provide for qualifying a new meter with specific power supply requirements. In one embodiment, aspects of the invention include a system, including: an electric meter having a housing; and a voltage-modifying device connected to the electric meter for modifying a received voltage, such that the electric meter operates in accordance with a predetermined power supply requirement, wherein the voltage-modifying device is located within the electric meter housing or external to the electric meter housing.

18 Claims, 7 Drawing Sheets

VOLTAGE-MODIFYING DEVICE FOR ELECTRIC METER

BACKGROUND OF THE INVENTION

The subject matter disclosed herein relates generally to a voltage-modifying device. More specifically, the present disclosure relates to a voltage-modifying device for an electric meter that provides higher voltage capability, lower voltage capability and/or high voltage transient protection.

Generally, electricity distribution is the final stage in the delivery of electricity to customers. In a typical electrical distribution system (e.g., electrical sub-stations, power lines, pole-mounted transformers, distribution wiring, electric energy meters, etc.), the electrical distribution system carries the electricity generated from a transmission system (e.g., power plant, transformers, high voltage transmission lines, etc.) and supplies the electricity to customers via an electric meter.

In industrial applications, there is a wide range of applicable power supplies. For example, in the U.S., industrial application power supplies range from 120 volts (V) to 480 V. Approximately ninety-seven percent of these applications fall within the 120V to 277V range. Therefore, only approximately three percent of the industrial applications require 480 V Delta configurations. Additionally, systems for oil and irrigation applications require 480 V with substantial transients due to long transmission lines and motor starts or stops. In Canada, industrial application power supplies require 600 V. There are also a small percentage of applications that require 57V to 120V. It is cost prohibitive to qualify a new meter for each specific power supply requirement at these lower volumes. Further, it may require extensive development time to qualify these new meters.

BRIEF DESCRIPTION OF THE INVENTION

Aspects of the invention provide for qualifying a new meter with specific power supply requirements. In one embodiment, aspects of the invention include a system, including: an electric meter having a housing; and a voltage-modifying device connected to the electric meter for modifying a received voltage, such that the electric meter operates in accordance with a predetermined power supply requirement, wherein the voltage-modifying device is located within the electric meter housing or external to the electric meter housing.

A first aspect of the invention provides a system, comprising: an electric meter having a housing; and a voltage-modifying device connected to the electric meter for modifying a received voltage, such that the electric meter operates in accordance with a predetermined power supply requirement, wherein the voltage-modifying device is located within the electric meter housing or external to the electric meter housing.

A second aspect of the invention provides a system, comprising: a power supply; an electric meter including an electronic board within a housing; and a voltage-modifying device connected to the electronic board and the power supply, the voltage-modifying device for modifying a received voltage from the power supply, such that the electric meter operates in accordance with a predetermined power supply requirement, wherein the voltage-modifying device is located within the electric meter housing or external to the electric meter housing.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Aspects of the invention provide for qualifying a new meter with specific power supply requirements. In one embodiment, aspects of the invention include a system, including: an electric meter having a housing; and a voltage-modifying device connected to the electric meter for modifying a received voltage, such that the electric meter operates in accordance with a predetermined power supply requirement, wherein the voltage-modifying device is located within the electric meter housing or external to the electric meter housing.

For example, as mentioned above, power supplies for industrial applications range from 120V to 480V. However, only approximately ninety-seven percent of these applications require 120V to 277V. It is more cost effective to design a 120V to 277V power supply instead of a 120V to 480V power supply The voltage-modifying device, according to aspects of the invention, enables a 120V to 277V power supply to be used for applications from 120V to 480V. Further, in oil and irrigation applications that require 480V Delta systems, overvoltage can often occur, which results in voltage transient problems. The voltage-modifying device described herein provides protection against high voltage transients. Therefore, it is not required to fully re-qualify a new meter for a specific power supply requirement of each application.

Figure 1:
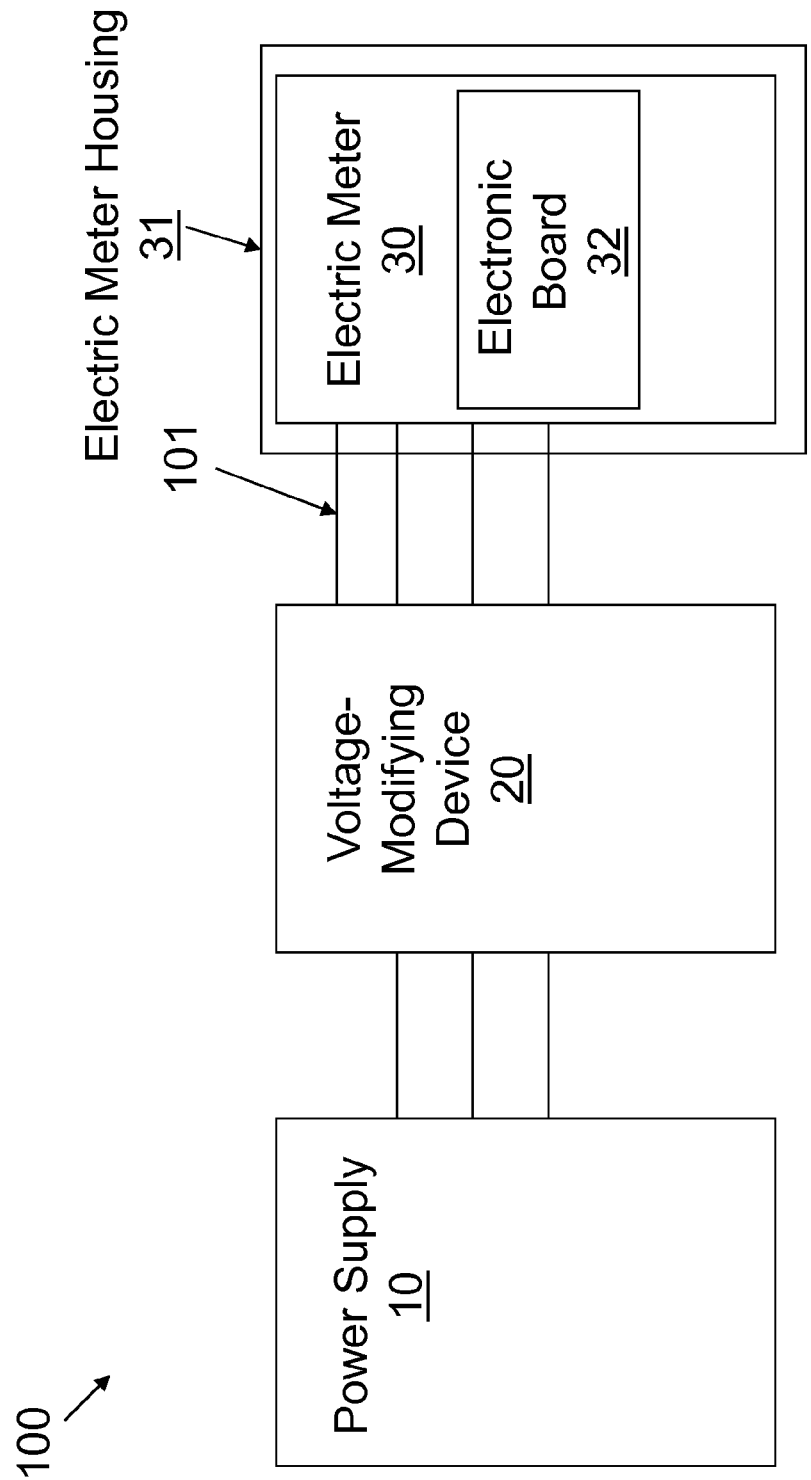
FIG. 1 shows a schematic diagram of a system according to aspects of the invention.
Figure 2:
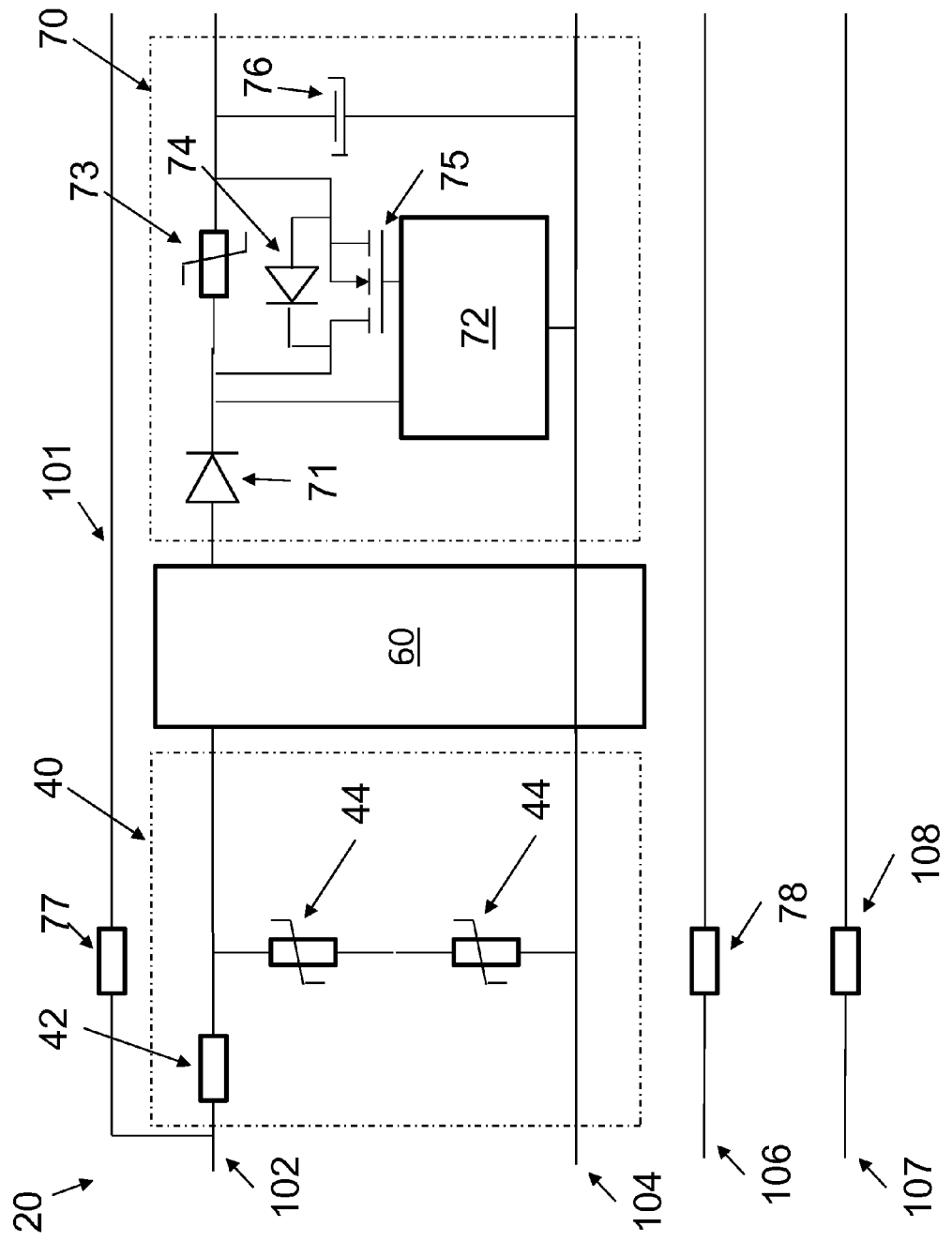
FIG. 2 shows a more detailed schematic diagram of a voltage-modifying device of a system according to aspects of the invention.

Turning to FIGS. 1 and 2, a schematic diagram of a system 100 according to aspects of the invention is shown. A power supply 10 may be connected to a voltage-modifying device 20. Voltage-modifying device 20 may be connected to an electronic board 32 of an electric meter 30. The electric meter 30 includes a housing 31. As will be described below, the voltage-modifying device 20 enables the electric meter 30 to operate in accordance with a predetermined power supply requirement. Although it is not shown, it is understood that the voltage-modifying device 20 may be located within the housing of the electric meter 30 or external to the electric meter 30.

System 100 will be described with respect to a three-phase power supply system. Accordingly, three lines (i.e., phases) connect the power supply 10 to the voltage-modifying device 20. An optional neutral line 107 is shown, that includes a resistor 108. An additional line (an adapter terminal) 101 connects the voltage-modifying device 20 to the electric meter 30. As will be described herein, the adapter terminal 101 provides voltage feedback and supply separation for the meter 30.

Although system 100, as described herein, is applied to a three-phase power supply system, it is understood that the applications of system 100 may be applied to any now known or later developed power supply system.

Turning now to FIG. 2, a more detailed schematic diagram of the voltage-modifying device 20 of system 100 is shown. System 100, and voltage-modifying device 20, is show including a first phase 102, a second phase 104, and a third phase 106. There may be an additional wire for neutral; however, the neutral wire has been omitted for clarity purposes. An adapter terminal 101 connects the voltage-modifying device 20 to the electric meter 30 (FIG. 1). As will be described herein, the adapter terminal 101 provides voltage feedback and supply separation for the meter 30.

As seen in FIG. 2, voltage-modifying device 20 includes a surge protection circuit 40 connected to first phase 102 and second phase 104. Surge protection circuit 40 includes a surge resistor 42 coupled in series with at least one varistor 44. FIG. 2 shows surge protection circuit 40 including two varistors 44; however, it is understood that surge protection circuit 40 may include any number of varistors 44. Varistor 44 may include a metal oxide varistor, or any now known or later developed type of varistor. Varistor 44 is used to protect against excess transient voltages by shunting the current created by the high voltage away from other parts of the circuit.

Voltage-modifying device 20 includes an electromagnetic interference (EMI) filtering device 60 coupled in series with the surge protection circuit 40. EMI is a disturbance that can affect the operation of the electrical circuitry within the voltage-modifying device 20 by interrupting, obstructing, or limiting the effect performance of the circuit. Examples of EMI filtering devices that may be used include a common mode choke, an x-capacitor, or an inductor and capacitor ("LC") filter. However, other EMI filtering devices, as known in the art, may be used.

In this embodiment of FIG. 2, voltage-modifying device 20 includes an overvoltage protection module 70. Overvoltage protection module 70 is configured to turn off power to the electric meter 30 (FIG. 1) in response to receiving a voltage that exceeds the predetermined power supply requirement. For example, a 120 V-480 V meter may turn off the power supply voltage to the switch power mode in order to protect it when there is a voltage more than 480V.

An overvoltage detection circuit 72, within the overvoltage protection module 70, detects when an overvoltage occurs. In response to an overvoltage occurring, the overvoltage detection circuit 72 turns on the overvoltage protection module 70. In the embodiment shown in FIG. 2, the overvoltage protection module 70 includes a diode 71 electrically connected in series with a varistor 73, a diode 74, and a metal-oxide-semiconductor field-effect transistor (MOSFET) 75, which are electrically connected in parallel. The overvoltage protection module 70 also includes a capacitor 76. However, it is understood that overvoltage protection module may include any devices necessary to turn off power to the electric meter (FIG. 1), in response to an overvoltage that exceeds the predetermined power supply requirement.

At least one additional resistor 77 may be provided for voltage feedback. For example, an additional resistor 77 is shown in FIG. 2 to provide voltage feedback of the first phase 102 to the meter 30 (FIG. 1) through the adapter terminal 101. This additional resistor 77 also provides a separate terminal 101 off of the first phase 102 in order to provide supply separation. A second additional resistor 78 may also be provided for voltage feedback and supply separation for the third phase 106. In this embodiment, the second phase 104 passes through EMI filtering device 60 and is used as a reference potential. This is often the case for a half-wave rectification system.

Figure 3:
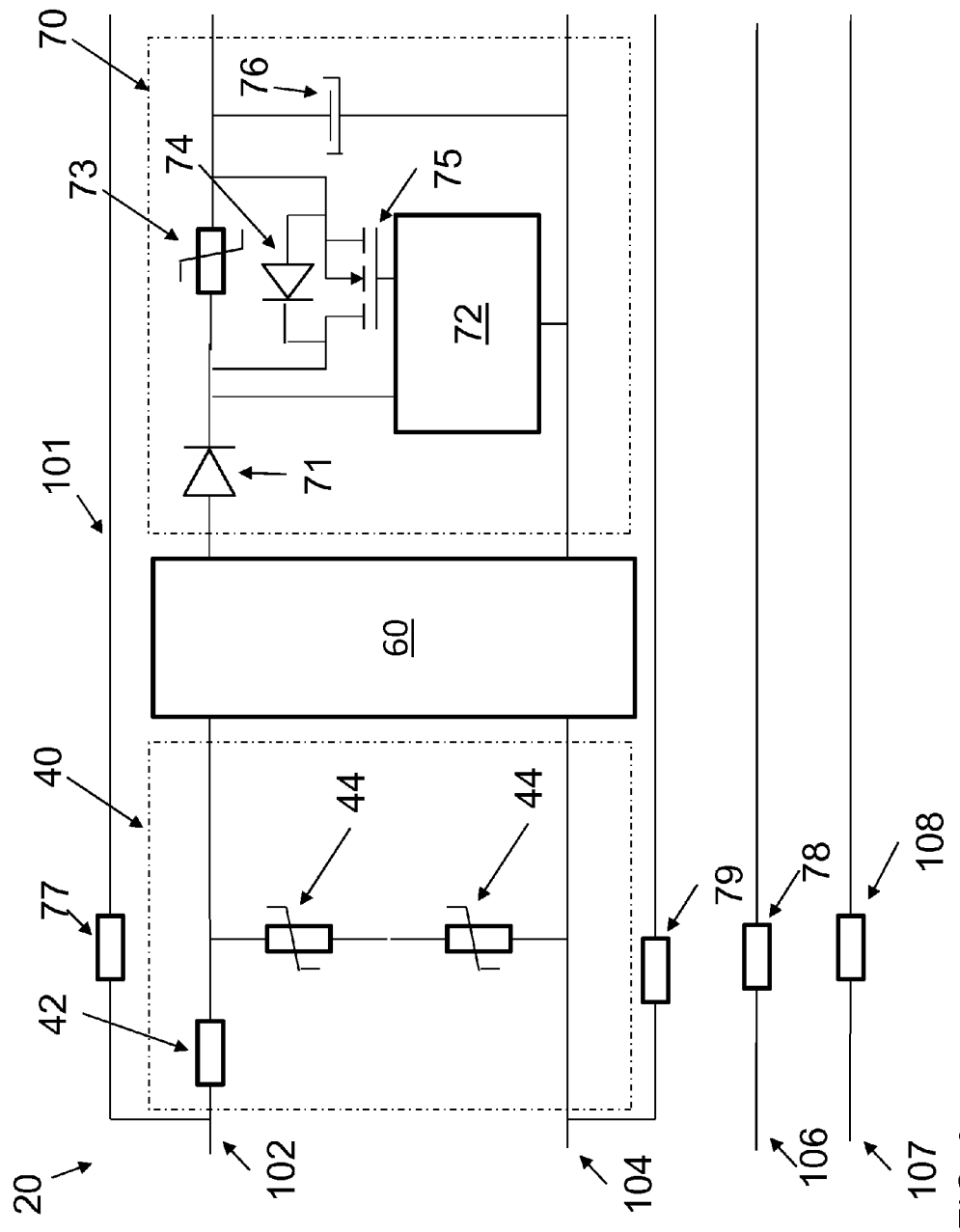
FIG. 3 shows a more detailed schematic diagram of a voltage-modifying device of a system according to aspects of the invention.

Turning now to FIG. 3, a detailed schematic diagram of an alternative embodiment of the voltage-modifying device 20 in FIG. 2 is shown. In this embodiment, a third additional resistor 79 is provided for the second phase 104. As with the first additional resistor 77 for the first phase 102 and the second additional resistor 78 for the third phase 106, this third additional resistor 79 provides voltage feedback and supply separation for the second phase 104. In this embodiment, the second phase 104 passes through the EMI filtering device 60.

Figure 4:
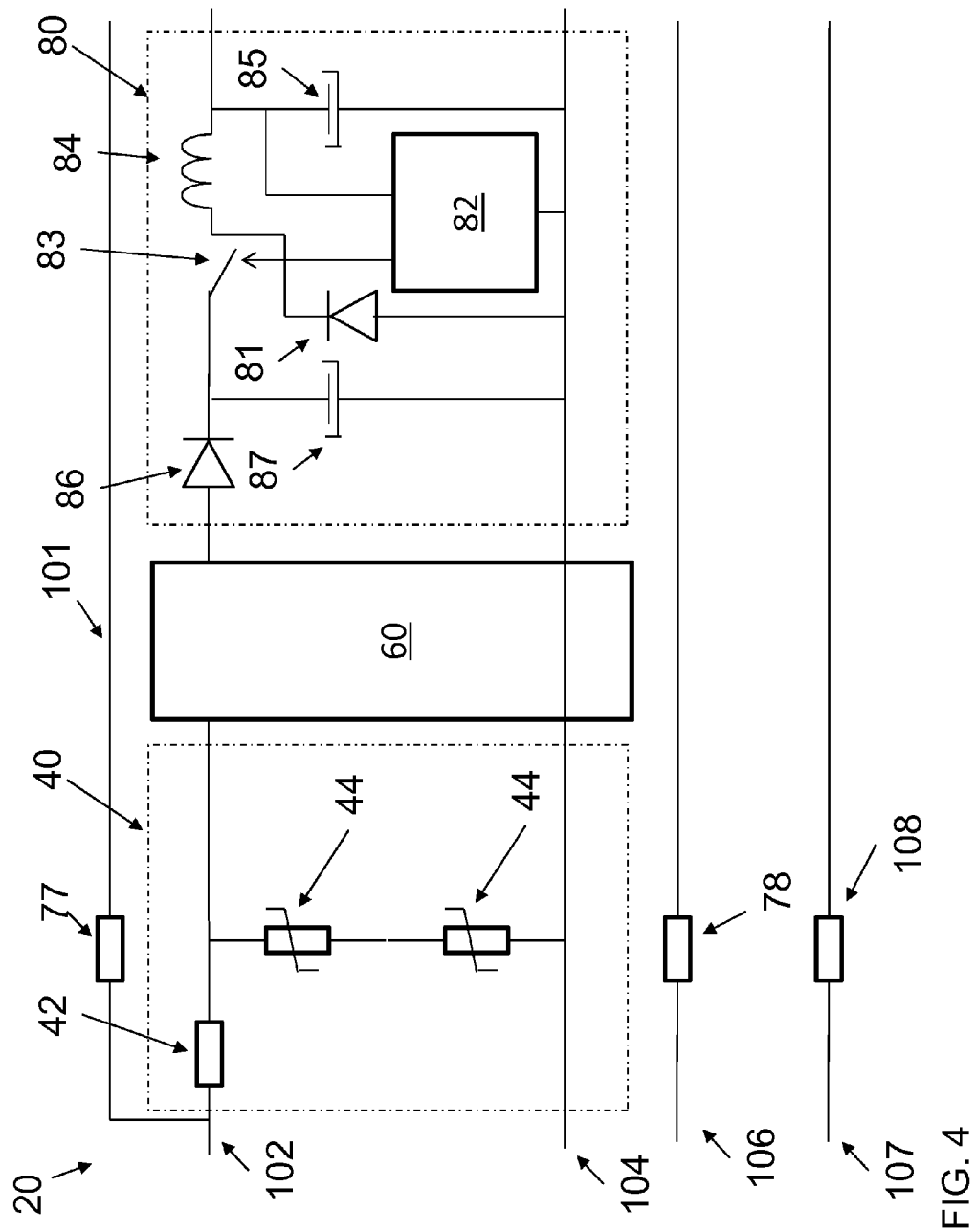
FIG. 4 shows a more detailed schematic diagram of a voltage-modifying device of a system according to aspects of the invention.

Turning now to FIG. 4, a detailed schematic diagram of an alternative embodiment of the voltage-modifying device 20 is shown. In this embodiment, the voltage-modifying device 20 includes a high voltage module 80 (or step-down circuit) coupled in series with the EMI filtering device 60. High voltage module 80 is configured to decrease a received voltage in response to the receiving a voltage that exceeds the predetermined power supply requirement. For example, the meter may be a 120V-277V meter and the voltage-modifying device 20 is configured to so that meter is compatible with higher voltage lines, such as, 600 V lines.

A buck control circuit 82, within the high voltage module 80, regulates and reduces the voltage to a voltage level that is compatible with the meter 30. For example, for a 120V-277V meter that is connected to 600V lines, the buck control circuit 82, within the voltage-modifying device 20, will reduce the voltage to a voltage that is compatible with the 120V-277V meter. As known to one of ordinary skill in the art, the buck converter includes two switches (a diode 81 and a switch 83), an inductor 84, and a capacitor 85. The two switches 81, 83 alternate between charging the inductor 84 and discharging the inductor 84 to decrease the voltage. It is understood that other configurations of a buck converter, as known in the art, may be used in high voltage module 80.

As seen in FIG. 4, the high voltage module 80 may include other electrical circuit components, such as an additional diode 86 and an additional capacitor 87. These may be known as half-wave rectification elements. However, it is understood that the high voltage module 80 may include any devices necessary to decrease the voltage to the electric meter (FIG. 1), in response to a voltage that exceeds the predetermined power supply requirement.

Similar to the embodiment shown in FIG. 2, at least one additional resistor 77 may be provided for voltage feedback. For example, an additional resistor 77 is shown in FIG. 4 to provide voltage feedback of the first phase 102 to the meter 30 (FIG. 1) through the adapter terminal 101. The additional resistor 77 also increases the voltage divider ratio of the voltage feedback. This additional resistor 77 also provides a separate terminal 101 off of the first phase 102 in order to provide supply separation. A second additional resistor 78 may also be provided for voltage feedback and supply separation for the third phase 106. In this embodiment, the second phase 104 does not pass through the EMI filtering device 60.

Figure 5:
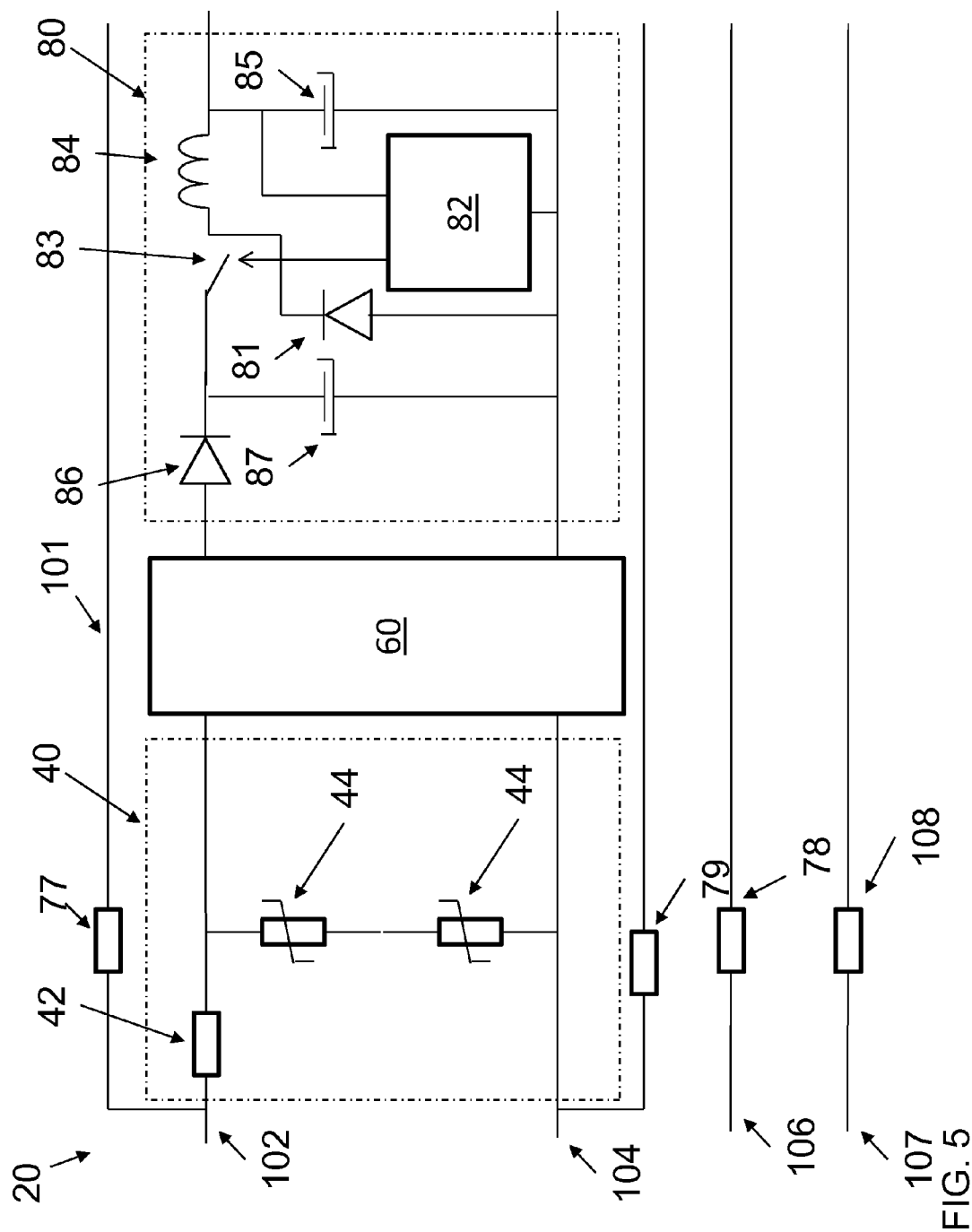
FIG. 5 shows a more detailed schematic diagram of a voltage-modifying device of a system according to aspects of the invention.

Turning now to FIG. 5, a detailed schematic diagram of an alternative embodiment of the voltage-modifying device 20 in FIG. 4 is shown. In this embodiment, a third additional resistor 79 is provided for the second phase 104. As with the first additional resistor 77 for the first phase 102 and the second additional resistor 78 for the third phase 106, this third additional resistor 79 provides voltage feedback and supply separation for the second phase 104. In this embodiment, the second phase 104 passes through the EMI filtering device 60.

Figure 6:
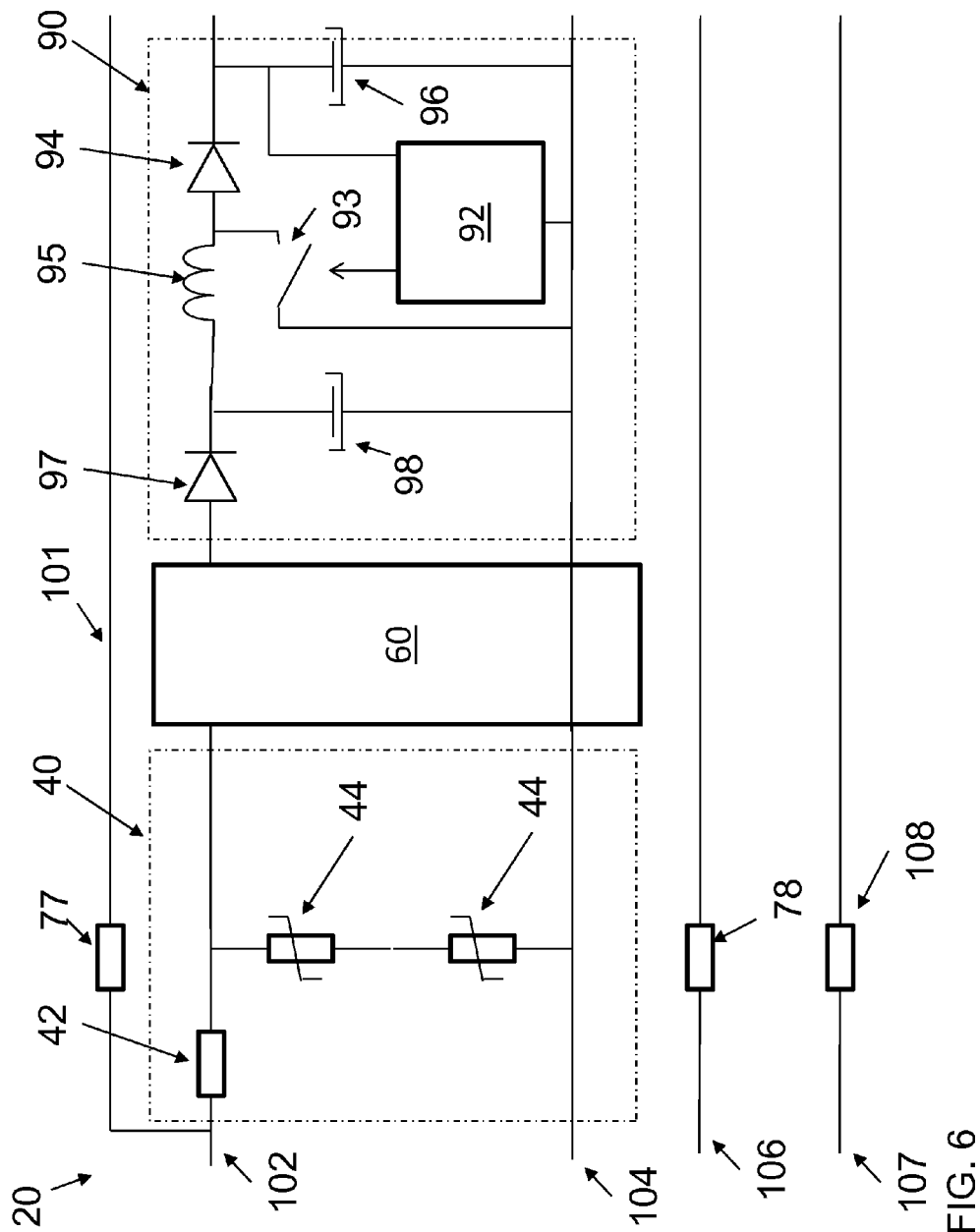
FIG. 6 shows a more detailed schematic diagram of a voltage-modifying device of a system according to aspects of the invention.

Turning now to FIG. 6, a detailed schematic diagram of an alternative embodiment of the voltage-modifying device 20 is shown. In this embodiment, the voltage-modifying device 20 includes a low voltage module 90 (or a step-up circuit), such as a boost converter, coupled in series with the EMI filtering device 60. Low voltage module 90 is configured to increase a received voltage in response to the receiving a voltage that does not meet the predetermined power supply requirement. For example, substation units may require 57 V-120 V power supplies, which would make the substation units not compatible with a 120V-277V meter.

A control circuit 92, within the low voltage module 90, regulates an input supply voltage from the power supply 10 (FIG. 1) to deliver a voltage that is compatible with a predetermined power supply requirement of the meter 30 (FIG. 1). The components within the low voltage module 90 make up a boost converter that increases the voltage from the power supply 10 (FIG. 1) to the predetermined power supply requirement of the meter 30 (FIG. 1). As known to one of ordinary skill in the art, the boost converter includes two switches (a switch 93 and a diode 94), an inductor 95, and a capacitor 96. The two switches 93, 94 alternate between charging the inductor 95 and discharging the inductor 95 to increase the voltage. It is understood that other configurations of a boost converter, as known in the art, may be used in low voltage module 90.

As seen in FIG. 6, the low voltage module 90 may include other electrical circuit components, such as an additional diode 97 and an additional capacitor 98. These may be known as half-wave rectification elements. However, it is understood that the low voltage module 90 may include any devices necessary to increase the voltage to the electric meter (FIG. 1), in response to a voltage that does not meet the predetermined power supply requirement.

Similar to the embodiment shown in FIG. 2, at least one additional resistor 77 may be provided for voltage feedback. For example, an additional resistor 77 is shown in FIG. 6 to provide voltage feedback of the first phase 102 to the meter 30 (FIG. 1) through the adapter terminal 101. The additional resistor 77 also increases the voltage divider ratio of the voltage feedback. This additional resistor 77 also provides a separate terminal 101 off of the first phase 102 in order to provide supply separation. A second additional resistor 78 may also be provided for voltage feedback and supply separation for the third phase 106. In this embodiment, the second phase 104 does not pass through the EMI filtering device 60.

Figure 7:
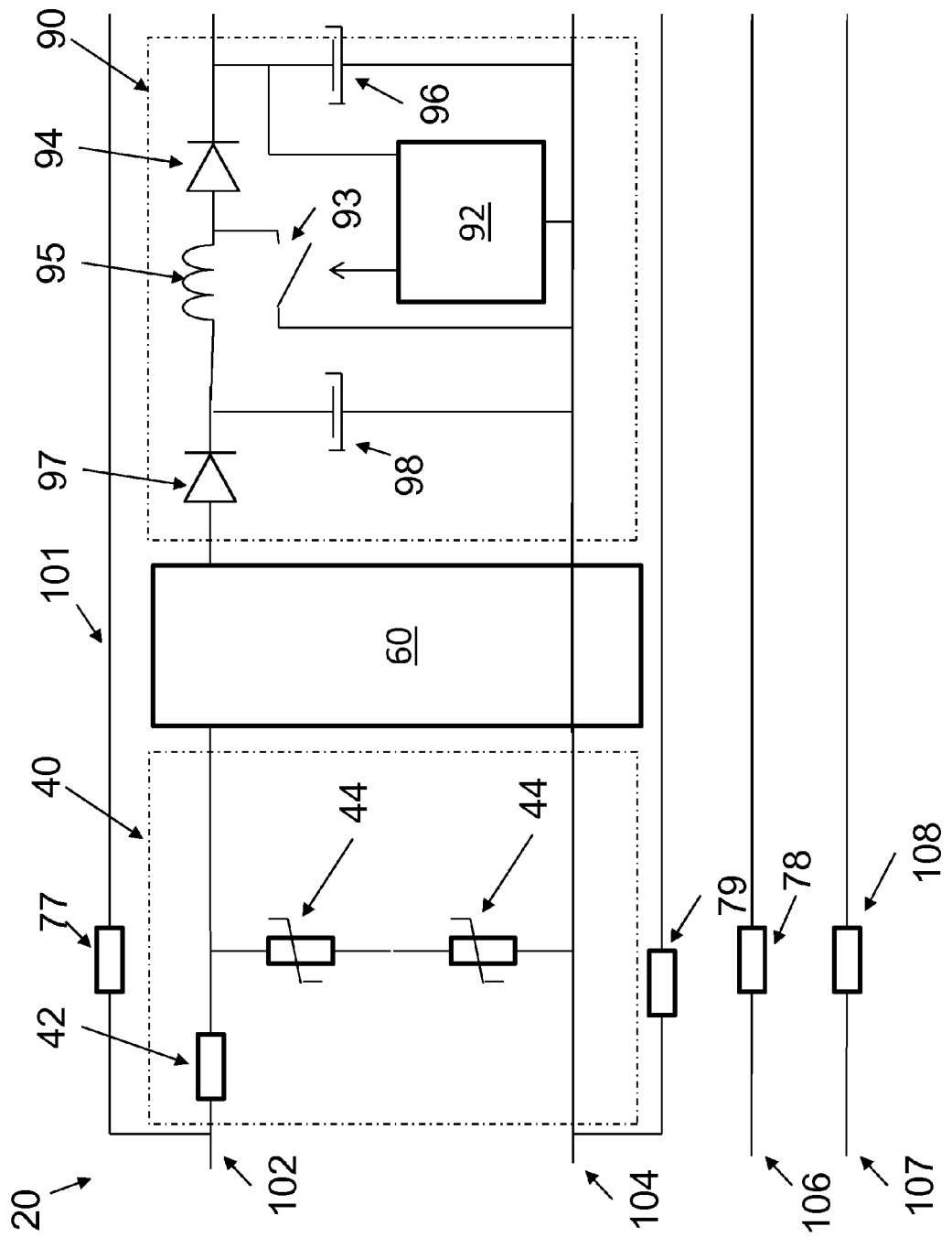
FIG. 7 shows a more detailed schematic diagram of a voltage-modifying device of a system according to aspects of the invention.

Turning now to FIG. 7, a detailed schematic diagram of an alternative embodiment of the voltage-modifying device 20 in FIG. 6 is shown. In this embodiment, a third additional resistor 79 is provided for the second phase 104. As with the first additional resistor 77 for the first phase 102 and the second additional resistor 78 for the third phase 106, this third additional resistor 79 provides voltage feedback and supply separation for the second phase 104. In this embodiment, the second phase 104 passes through the EMI filtering device 60.

Although not shown in the figures, it is understood that the voltage-modifying device 20 may include a combination of the embodiment shown in FIGS. 4-5 and the embodiment shown in FIGS. 6-7. That is, the voltage-modifying device 20 may include a buck-boost converter or a sepic converter, which can increase or decrease the received voltage to the predetermined power supply requirement of the meter 30.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A system, comprising:
    an electric meter having a housing, wherein the electric meter includes an adapter terminal; and
    a voltage-modifying device connected to the electric meter for modifying a received voltage, such that the electric meter operates in accordance with a predetermined power supply requirement, wherein the voltage-modifying device is located within the electric meter housing or external to the electric meter housing, and wherein the voltage-modifying device connects to the electric meter via the adapter terminal, wherein the adapter terminal provides a voltage feedback directly to the electric meter separate from a power supply.

2. The system according to claim 1, wherein the voltage-modifying device includes an overvoltage transient protection module.

3. The system according to claim 2, wherein the overvoltage transient protection module includes a circuit that is configured to turn off power to the electric meter in response to the received voltage exceeding the predetermined power supply requirement.

4. The system according to claim 1, wherein the voltage-modifying device includes a high voltage, step-down module.

5. The system according to claim 4, wherein the high voltage, step-down module includes a circuit that is configured to decrease the received voltage in response to the received voltage exceeding the predetermined power supply requirement.

6. The system according to claim 1, wherein the voltage-modifying device includes a low voltage, step-up module.

7. The system according to claim 6, wherein the low voltage, step-up module includes a circuit that is configured to increase the received voltage in response to the received voltage not meeting the predetermined power supply requirement.

8. The system according to claim 1, wherein the voltage-modifying device includes a buck-boost converter.

9. The system according to claim 8, wherein the buck-boost converter includes a circuit that is configured to, in response to the received voltage exceeding the predetermined power supply requirement, decrease the received voltage, and, in response to the received voltage not meeting the predetermined power supply requirement, increase the received voltage.

10. A system, comprising:
   a power supply;
   an electric meter including an electronic board within a housing, wherein the electric meter includes an adapter terminal; and
   a voltage-modifying device connected to the electronic board and the power supply, the voltage-modifying device for modifying a received voltage from the power supply, such that the electric meter operates in accordance with a predetermined power supply requirement, wherein the voltage-modifying device is located within the electric meter housing or external to the electric meter housing, and wherein the voltage-modifying device connects to the electric meter via the adapter terminal, wherein the adapter terminal provides a voltage feedback directly to the electric meter separate from a power supply.

11. The system according to claim 10, wherein the voltage-modifying device includes an overvoltage transient protection module.

12. The system according to claim 11, wherein the overvoltage transient protection module includes a circuit that is configured to turn off power to the electric meter in response to the received voltage exceeding the predetermined power supply requirement.

13. The system according to claim 10, wherein the voltage-modifying device includes a high voltage, step-down module.

14. The system according to claim 13, wherein the high voltage, step-down module includes a circuit that is configured to decrease the received voltage in response to the received voltage exceeding the predetermined power supply requirement.

15. The system according to claim 10, wherein the voltage-modifying device includes a low voltage, step-up module.

16. The system according to claim 15, wherein the low voltage, step-up module includes a circuit that is configured to increase the received voltage in response to the received voltage not meeting the predetermined power supply requirement.

17. The system according to claim 10, wherein the voltage-modifying device includes a buck-boost converter.

18. The system according to claim 17, wherein the buck-boost converter includes a circuit that is configured to, in response to the received voltage exceeding the predetermined power supply requirement, decrease the received voltage, and, in response to the received voltage not meeting the predetermined power supply requirement, increase the received voltage.

* * * * *